US006824396B2

(12) United States Patent
Koopman et al.

(10) Patent No.: US 6,824,396 B2
(45) Date of Patent: Nov. 30, 2004

(54) COMPLIANT CONNECTOR FOR LAND GRID ARRAY

(75) Inventors: Stephen P. Koopman, Floyds Knobs, IN (US); Joshua Ferry, Georgetown, IN (US)

(73) Assignee: Samtec, Inc., New Albany, IN (US)

( * ) Notice: Subject to any disclaimer, the term of this patent is extended or adjusted under 35 U.S.C. 154(b) by 0 days.

(21) Appl. No.: 10/822,340

(22) Filed: Apr. 12, 2004

(65) Prior Publication Data

US 2004/0192081 A1 Sep. 30, 2004

Related U.S. Application Data

(60) Continuation of application No. 10/438,343, filed on May 15, 2003, now Pat. No. 6,758,683, which is a division of application No. 09/871,136, filed on May 31, 2001, now Pat. No. 6,585,527.

(51) Int. Cl.[7] .......................... H01R 12/00; H05K 1/00
(52) U.S. Cl. .......................................................... 439/71
(58) Field of Search ............................ 439/71, 66, 862

(56) References Cited

U.S. PATENT DOCUMENTS 4,445,735 A 5/1984 Bonnefoy
4,593,961 A 6/1986 Cosmo
4,655,524 A 4/1987 Etzel
4,793,814 A 12/1988 Zifcak et al.
5,049,084 A 9/1991 Bakke
5,061,192 A 10/1991 Chapin et al.
5,203,710 A 4/1993 Miyazawa
5,227,959 A 7/1993 Rubinstein et al.
5,338,231 A 8/1994 Wilhite
5,395,252 A 3/1995 White
5,551,883 A 9/1996 Davis
5,655,913 A 8/1997 Castaneda et al.
5,711,690 A 1/1998 Thrush et al.
5,762,505 A 6/1998 Lin
5,806,181 A 9/1998 Khandros et al.
5,829,128 A 11/1998 Eldridge et al.
5,900,738 A 5/1999 Khandros et al.
5,913,687 A 6/1999 Rathburn
5,917,707 A 6/1999 Khandros et al.
5,926,951 A 7/1999 Khandros et al.
5,938,451 A 8/1999 Rathburn (List continued on next page.)

*Primary Examiner*—Javaid H. Nasri
(74) *Attorney, Agent, or Firm*—Keating & Bennett, LLP

(57) ABSTRACT

A connector assembly for providing electrical continuity between an array of contacts on an electrical component and a corresponding array of contacts on a printed circuit board. The connector assembly includes a plurality of floating pins. Floatation of the pin within a receptacle of the component body provides a first mode of compliance for electrical components, connector assemblies and printed circuit boards that are not coplanar. For a second mode of compliance to account for non-planarity, each pin includes an elongated, elastically deformable cantilever beam. Each pin is adapted and configured to accommodate the deformed cantilever beam of an adjacent pin without mechanical or electrical contact or interference.

84 Claims, 5 Drawing Sheets

U.S. PATENT DOCUMENTS

| | | | |
|---|---|---|---|
| 5,974,662 | A | 11/1999 | Eldridge et al. |
| 5,975,914 | A | 11/1999 | Uchida |
| 5,983,493 | A | 11/1999 | Eldridge et al. |
| 5,984,692 | A | 11/1999 | Kumagai et al. |
| 5,984,693 | A | 11/1999 | McHugh et al. |
| 5,994,152 | A | 11/1999 | Khandros et al. |
| 5,998,864 | A | 12/1999 | Khandros et al. |
| 6,023,103 | A | 2/2000 | Chang et al. |
| 6,029,344 | A | 2/2000 | Khandros et al. |
| 6,033,935 | A | 3/2000 | Dozier, II et al. |
| 6,043,563 | A | 3/2000 | Eldridge et al. |
| 6,049,976 | A | 4/2000 | Khandros |
| 6,050,829 | A | 4/2000 | Eldridge et al. |
| 6,135,783 | A | 10/2000 | Rathburn |
| 6,142,792 | A | 11/2000 | Yang |
| 6,146,152 | A | 11/2000 | McHugh et al. |
| 6,168,974 | B1 | 1/2001 | Chang et al. |
| 6,203,331 | B1 | 3/2001 | McHugh et al. |
| 6,217,342 | B1 | 4/2001 | Neidich et al. |
| 6,276,973 | B1 | 8/2001 | Lin et al. |
| 6,290,507 | B1 | 9/2001 | Neidich et al. |
| 6,296,495 | B1 | 10/2001 | Wang et al. |
| 6,315,576 | B1 | 11/2001 | Neidich |

COMPLIANT CONNECTOR FOR LAND GRID ARRAY

This application is a Continuation application of prior application Ser. No. 10/438,343, filed May 15, 2003, now U.S. Pat. No. 6,758,683, which is a Divisional application of prior application Ser. No. 09/871,136, filed May 31, 2001, now U.S. Pat. No. 6,585,527.

FIELD OF THE INVENTION

The present invention relates to apparatus and methods for providing electrical continuity between two objects, and more particularly to an array of solderless connectors for use with a land grid array integrated circuit package.

BACKGROUND OF THE INVENTION

Land grid array (LGA) connector assemblies are commonly used with integrated circuit (IC) packages, such as in applications which do not require soldering of the pins of the LGA connector assembly to either the IC package or a corresponding circuit board. As one example, an LGA connector assembly can be used to temporarily place an LGA package in electrical communication with a circuit card during test, emulation, and debug procedures. As another example, the LGA socket assembly can be used for upgrades and replacements of LGA packages onto circuit boards.

The present invention incorporates a variety of novel and unobvious features which are improvements over currently existing LGA socket assemblies.

SUMMARY OF THE INVENTION

One aspect of the present invention includes an apparatus for providing electrical continuity between two objects. The apparatus includes a body with a top surface and a bottom surface, the body defining a plurality of pin receptacles, each receptacle including a guiding slot within the body between the top and bottom surfaces. The apparatus includes a plurality of pins, each one of the pins being located within a different one of the plurality of receptacles, each pin including a centerbody with two edges, a first member extending from the centerbody, a first cantilever beam extending from the centerbody, and a second cantilever beam extending from the centerbody. The first member of each one of the plurality of pins cooperates with the guiding slot of the corresponding receptacle to guide the pin within the receptacle, each pin being freely moveable within the corresponding receptacle.

Another aspect of the present invention includes an apparatus for providing electrical continuity between two objects. The apparatus includes a body with a top surface and a bottom surface, the body defining a plurality of pin receptacles, each receptacle including an aperture. The apparatus includes a plurality of pins, each one of the pins being loose within a different one of the plurality of receptacles, each pin including a centerbody, a first cantilever beam extending from of the centerbody at an acute angle relative to the centerbody, and a second cantilever beam extending from the centerbody at an acute angle relative to the centerbody. The first cantilever beam includes a free end that extends over an adjacent one of the pins.

Another aspect of the present invention includes an apparatus for providing electrical continuity between two objects. The apparatus includes a body with a top surface and a bottom surface, the body defining a plurality of pin receptacles, each receptacle including an aperture and a guiding slot within the body. The apparatus includes a plurality of pins located within the plurality of receptacles, each pin including a planar centerbody, a first member extending from the centerbody and cooperating with the guiding slot to loosely locate each pin within a corresponding receptacle, and a first cantilever beam extending from the centerbody. The centerbody includes a projection extending from a surface of the centerbody, the projection cooperating with the receptacle to limit sliding motion of said pin within the receptacle.

These and other aspects of the present invention will be apparent from the claims, drawings, and the description of the preferred embodiment to follow.

DESCRIPTION OF THE PREFERRED EMBODIMENTS

Figure 1:
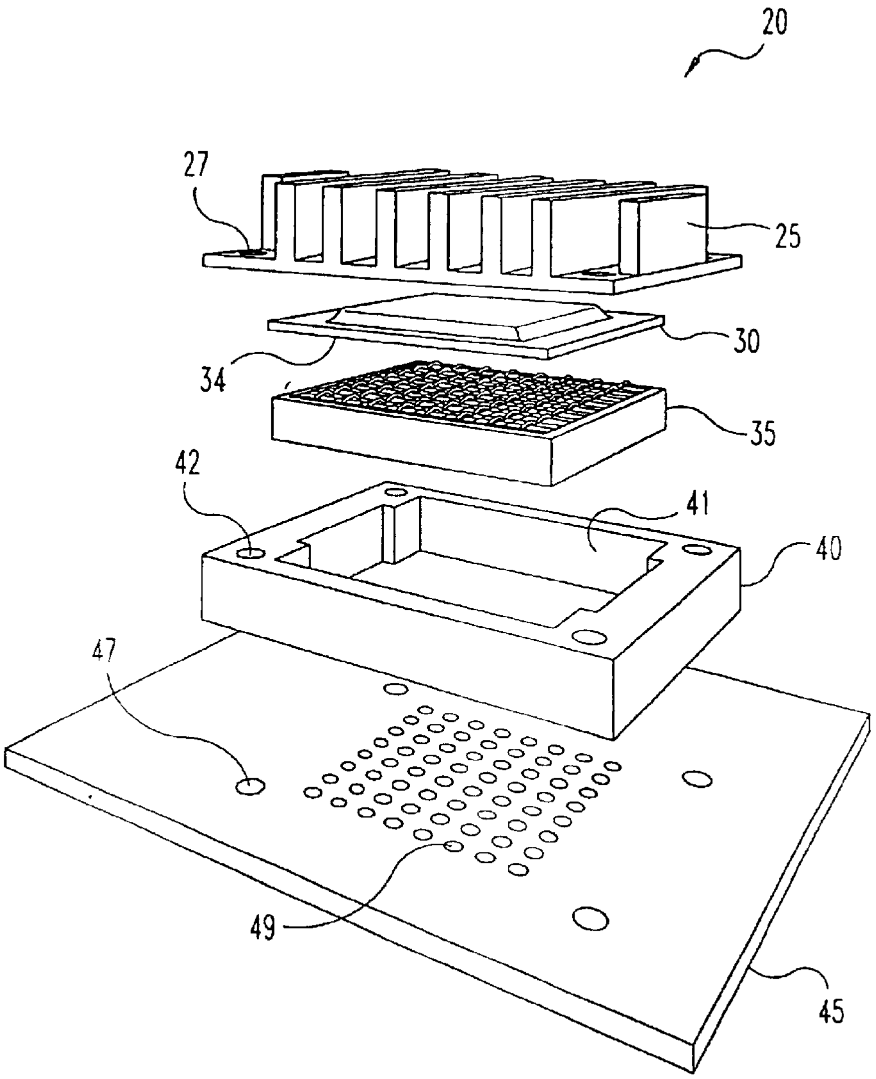
FIG. 1 is a perspective exploded view of an electronic assembly according to one embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

One embodiment of the present invention includes a connector assembly for providing electrical continuity between arrays of contacts on two objects, such as between an electrical component and a printed circuit board, or two printed circuit boards or two electrical components. The connector assembly includes a plurality of floating pins. Floatation of the pin within a receptacle of the component body provides a first mode of compliance or correction for electrical components, connector assemblies, and printed circuit boards that are not coplanar. For a second mode of compliance or correction to account for non-planarity, each pin includes an elongated, elastically deformable cantilever beam. Each pin is adapted and configured to accommodate the deformed cantilever beam of an adjacent pin without mechanical or electrical contact or interference.

FIG. 1 is an exploded, perspective view of an electronic assembly 20 according to one embodiment of the present invention. Assembly 20 includes a heat sink or cap 25 placed on top of an electronic component 30. Electronic component 30 may be of any type, including various land grid arrays (LGA) containing integrated circuits packaged therein. The bottom side of electronic component 30 includes a two dimensional arrangement (in rows and columns) of electrical contact pads 34 that are in electrical communication with the integrated circuits contained within component 30. The various signals from the integrated circuits contained within component 30 are communicated by a land grid array connector assembly 35 to various contacts 49 located on a printed circuit board 45. An attachment frame 40 includes a central aperture 41 in which LGA connector assembly 35 is located. A plurality of fasteners (not shown) cooperating with fastener holes 27, 42, and 47 maintain assembly 20 in a compressed, assembled state. In another embodiment of the present invention, connector assembly 35 includes four ears projecting from each corner of the assembly, each ear including a corresponding fastener hole that aligns with holes 27 and 47. Assembly 20 is useful for methods including electrical testing and component burn-in of component 30. LGA connector assembly 35 provides reliable, temporary electrical communication between LGA component 30 and printing circuit board 45 in a manner which will be described.

Figure 2:
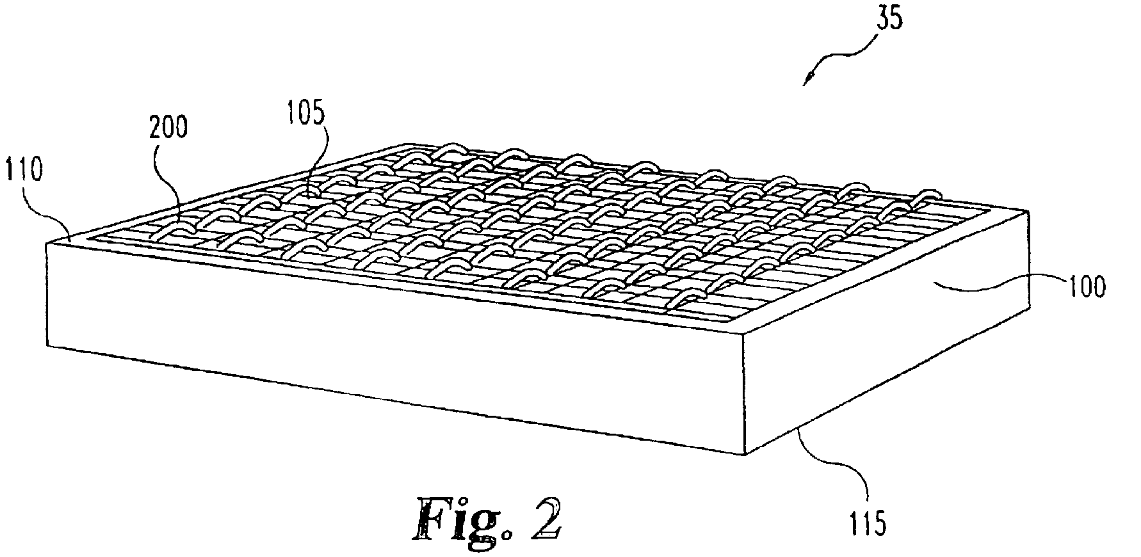
FIG. 2 is a perspective view of the connector assembly of FIG. 1 according to one embodiment of the present invention.
Figure 3:
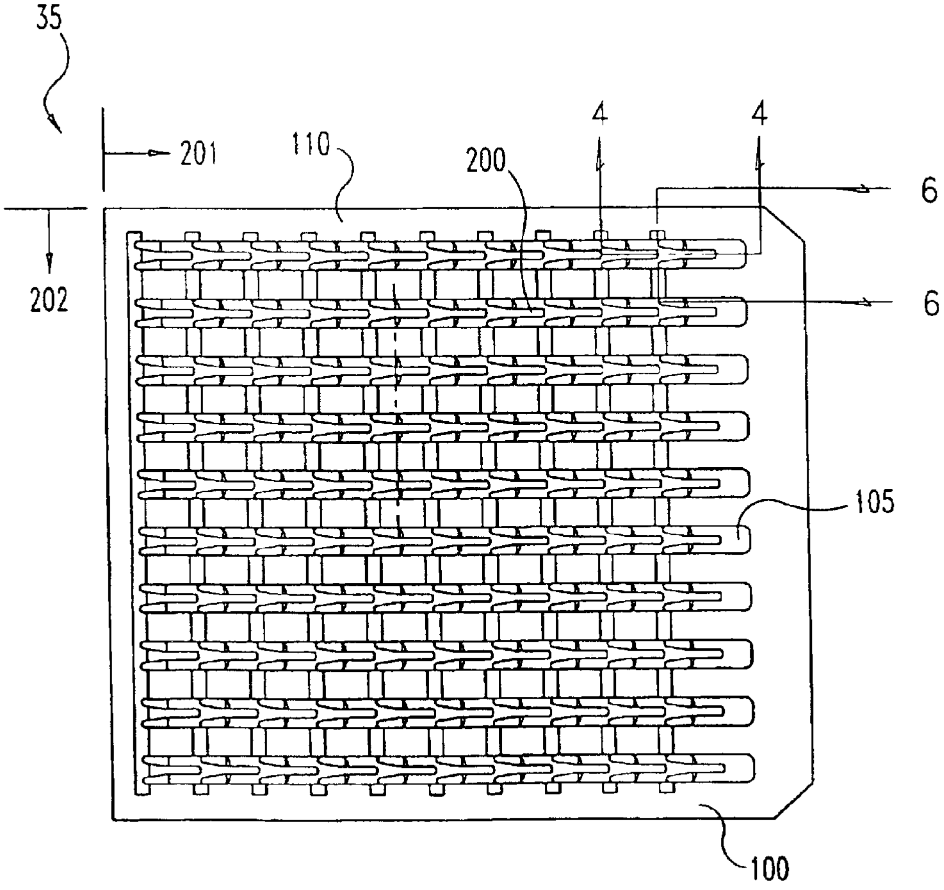
FIG. 3 is a top view of the connector assembly of FIG. 2.
Figure 4:
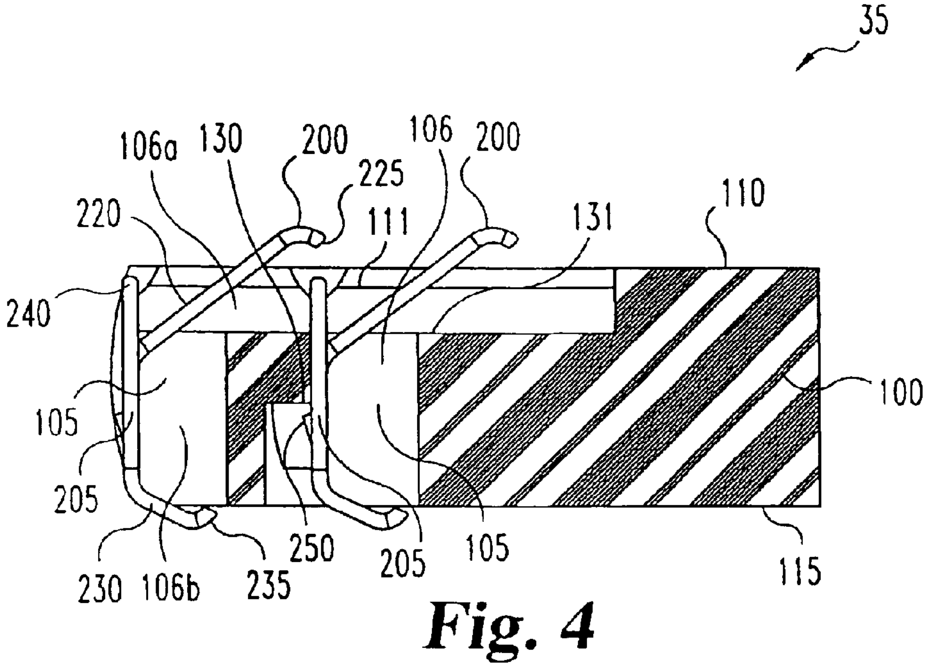
FIG. 4 is a partial, cross-sectional side elevational view of the connector assembly of FIG. 3 as taken along line 44 of FIG. 3.

With reference now FIGS. 2, 3, and 4, a connector assembly 35 according to one embodiment of the present invention is shown. Connector assembly 35 includes a body 100 which defines a plurality of pin receptacles 105 therein. Preferably, each of the plurality of receptacles 105 includes an elastically deformable pin 200 which provides electrical continuity from a contact 34 of component 30 to a contact 49 of printed circuit board 45. As best seen in FIG. 3, receptacles 105 are arranged in a plurality of columns in a first direction 201, and a plurality of rows in a second direction 202, such as to form a two dimensional matrix of receptacles 105 and corresponding pins 200.

In a preferred embodiment, body 100 is molded from a non-conductive material such as Vectra El30i. A preferred embodiment includes a spacing of 0.050 inches between adjacent columns, and a preferred spacing of 0.050 inches between adjacent rows. In yet another embodiment, the preferred spacing between adjacent rows is 1 millimeter, and the spacing between adjacent columns is 1 millimeter. Preferably, the height of body 100 from planar upper surface 110 to planar lower surface 115 is approximately 1.065 inches.

Various materials and dimensions are described herein. These materials and dimensions are given as examples, and are intended to be non-limiting examples.

Referring to FIG. 4, in a preferred embodiment each receptacle 105 includes a corresponding pin 200 loosely located therein. Each receptacle 105 includes an aperture 106 located therein that extends from top surface 110 to bottom surface 115. The top portion 106*a* of aperture 106 extends along direction 201 for a distance longer than the distance which bottom portion 106*b* of aperture 106 extends along that same direction. Thus, as best seen in FIGS. 4 and 5, aperture 106 has the appearance of a sideways "L".

Figure 5:
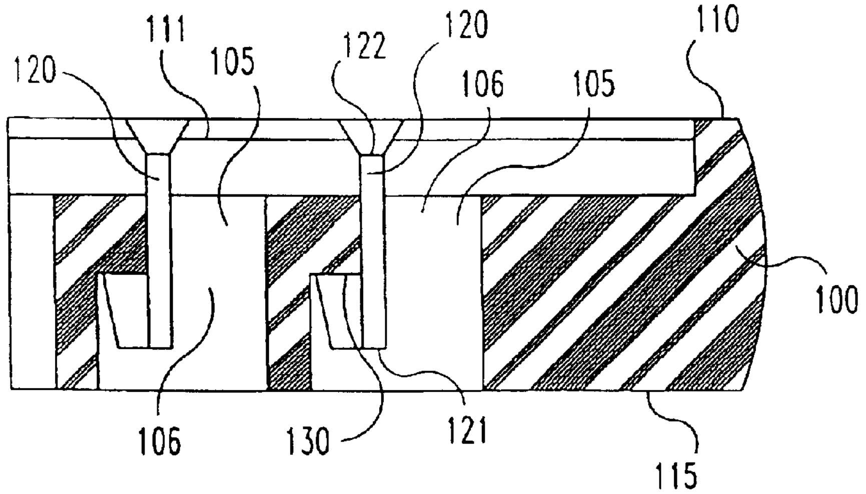
FIG. 5 is a side-elevational view of the connector assembly of FIG. 4 with the pins removed.
Figure 6:
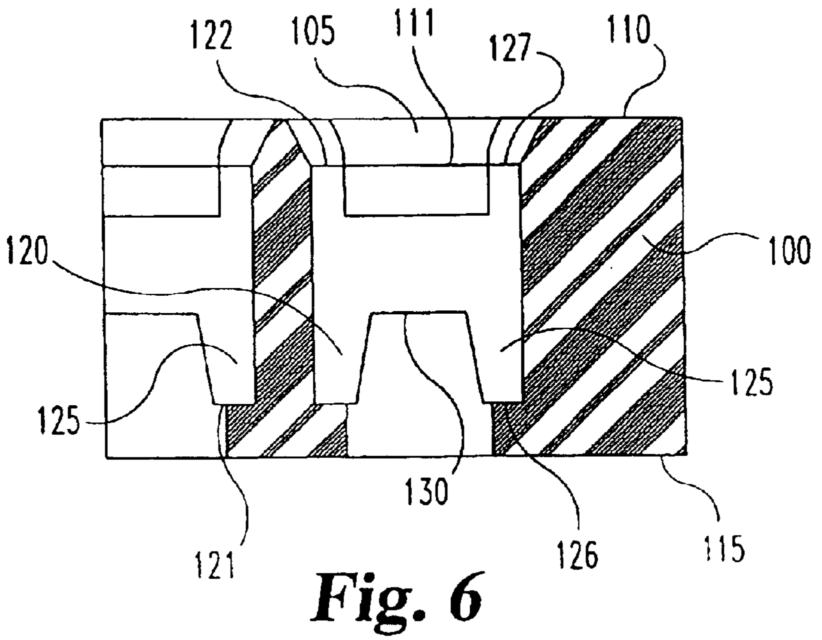
FIG. 6 is a cross-sectional, front elevational view of the connector assembly of FIG. 3 as taken along line 6—6 of FIG. 3.
Figure 7:
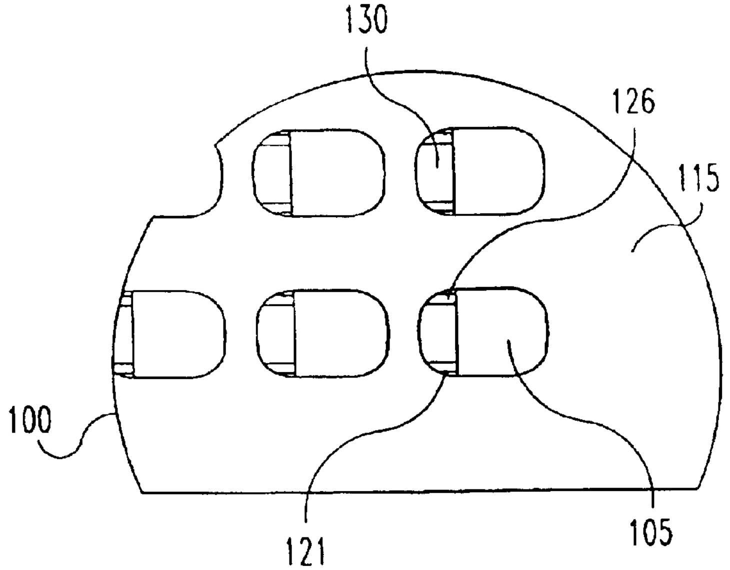
FIG. 7 is a partial bottom view of the connector body of FIG. 3, with the pins removed.

Referring to FIGS. 5, 6, and 7, each receptacle 105 preferably includes a pair of enclosed guiding slots 120 and 125 located along either side of receptacle 105 (as best seen in FIG. 6), and a bottom-facing surface 130 located between guiding slots 120 and 125. Slot 120 includes a bottom-facing aperture 121 and a top-facing aperture 122. Guiding slot 425 includes a bottom-facing aperture 126 and a top-facing aperture 127. Each guiding slot 120 and 125 preferably defines an internal channel from the bottom-facing aperture to the top-facing aperture which is preferably square in cross section with a dimension of 0.0055 inches×0.0055 inches. A top surface 111 of body 100 extends between top-facing apertures 122 and 127.

Figure 8:
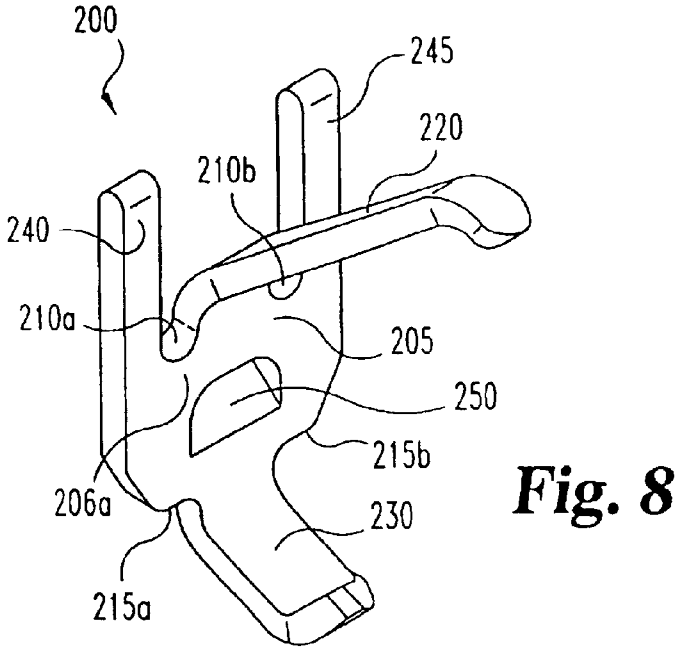
FIG. 8 is a top, side, and frontal perspective view of a connector pin according to one embodiment of the present invention.
Figure 9:
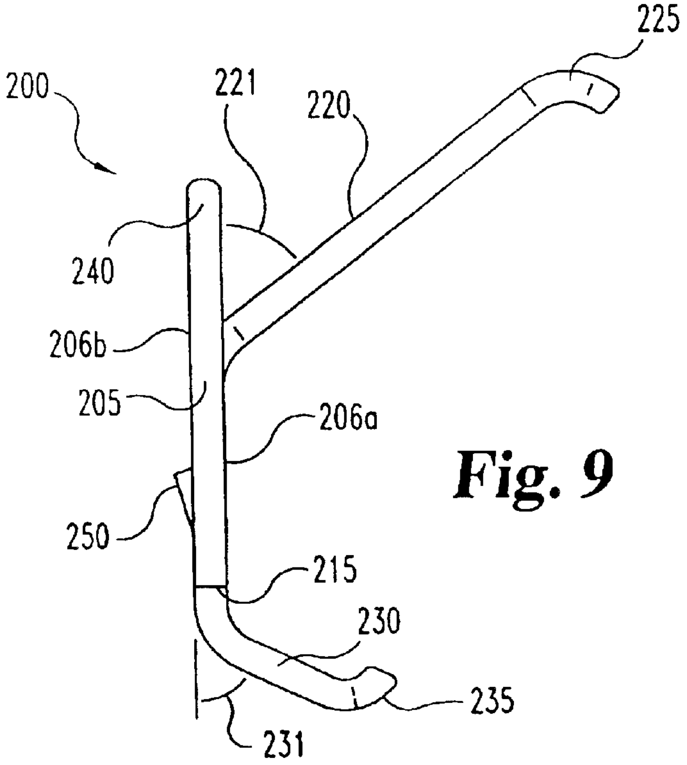
FIG. 9 is a side elevational view of the pin of FIG. 8.

FIGS. 8 and 9 show perspective and side elevational views, respectively, of a pin 200 according to one embodiment of the present invention. Each pin 200 includes a centerbody 205 having top edges 210*a* and 210*b*, and bottom edges 215*a* and 215*b*. Centerbody 205 is preferably planar and manufactured from sheet material. Each centerbody 205 includes front and rear planar surfaces 206*a* and 206*b*, respectively.

Each pin 200 includes a first cantilever beam 220 extending from the top edge of the centerbody 205 and a second cantilever beam 230 extending from the bottom edge of the centerbody 205. First cantilever beam 220 extends relative to a planar surface of centerbody 205 at an acute angle 221. Second cantilever beam 230 extends relative to a planar surface of centerbody 205 at an acute angle 231. Preferably, angle 221 is greater than about 40 degrees, less than about 75 degrees, and most preferably is about 52 degrees. Angle 231 is preferably more than about 45 degrees, less than about 80 degrees, and most preferably is about 64 degrees.

Top cantilever beam 220 includes a free end 225 which is adapted and configured to have an external surface which provides electrical continuity with a contact 34 of component 30. Second cantilever beam 230 preferably includes a free end 235 adapted and configured to have an outward surface for providing electrical continuity with a contact 49 of printed circuit board 45. In a most preferred embodiment, free end 225 is formed to have a radius on the inward surface of about 0.010 inches, and free end 235 is formed to have a radius on the inward surface of about 0.0075 inches.

Top cantilever beam 220 preferably has a width which varies from approximately 0.015 as it extends out from centerbody 205, and tapers to about 0.006 to 0.008 near free end 225. Preferably, second cantilever beam 230 has a constant width of about 0.013 inches. Preferably, pin 200 is fabricated from a material with good spring characteristics and high conductivity, such as #25 BeCu, 4a hard, and age hardened with a tensile strength between 185 to about 215 KSI. Preferably, the material has a thickness of about 0.0042 inches.

Referring to FIG. 9, first cantilever beam 220 has a length that is longer than the length of second cantilever beam 230. The furthest most edge of free end 225 is preferably about 0.055 inches from planar surface 206*b* of centerbody 205. The furthest edge of free end 235 is preferably about 0.025 inches from planar surface 206*b*. Therefore, free end 225 is horizontally displaced from free end 235 by about 0.03 inches. Referring to FIG. 1, this offset results in a similar offset in apparatus 20, such that a corresponding contact pad 34 of component 30 is offset horizontally from the corresponding contact 49 of circuit board 45. Referring to FIG. 4, each pin 200 includes a first cantilever beam adapted and configured to have a free end 225 that extends over the centerbody 205 of the adjacent pin.

Each pin 200 also includes features to guide and limit sliding of pin 200 within a receptacle 105 of body 100. Each pin 200 includes first and second members 240 and 245, respectively, extending from edge 210 of centerbody 205, and straddling cantilever beam 220. Each member 240 and

245 is generally coplanar with centerbody 205, as best seen in FIG. 9. Cantilever beam 220 extends from a central portion of one edge of centerbody 205, with first member 240 extending from the edge adjacent to one side of the cantilever beam and second member 245 extending from the edge adjacent to the other side of cantilever beam 220.

Centerbody 205 includes a projection 250 that extends from planar surface 206*b* of centerbody 205, as best seen in FIGS. 8 and 9. Projection 250 extends about 0.0024 inches from planar surface 206*b*.

As seen in FIG. 4, pins 200 are in the free state, with free end 225 being above top surface 110, and free end 235 of second cantilever beam 230 being below bottom surface 115. However, when connector assembly 35 is used as shown in apparatus 20 of FIG. 1, the bottom surface of electronic component 30 deflects each first cantilever beam 220 downward until the top most surface of free end 225 is at or near the plane defined by top surface 110. Likewise, contact with the surface of printed circuit board 45 deforms free end 235 of second cantilever beam 230 so that the exterior surface of free end 235 is at or near a plane defined by bottom surface 115.

However, contact pressure against second cantilever beam 235, owing to its greater stiffness as compared to first cantilever beam 220, also results in limited upward sliding motion of pin 220 within guiding slots 120 and 125 of receptacle 105. As best seen in FIG. 4, the first member 240 extending from centerbody 205 is slidingly received within a guiding slot 120 of the corresponding receptacle. Likewise, the second member 245 extending from centerbody 205 is slidingly received within second guiding slot 125. The cooperation of first and second members 240 and 245 with guiding slots 120 and 125, respectively, limit sliding motion of pin 200 within receptacle 105 to a vertical orientation (as seen in FIG. 4). However, the loose sliding motion of pin 200 within receptacle 105 is limited. Still referring to FIG. 4, sliding motion in the downward motion is limited by contact of cantilever beam 220 with a surface 131 of body 100. Upward sliding motion of pin 200 within receptacle 105 is limited by contact of projection 250 with surface 130 of body 100.

Owing to the greater stiffness of cantilever beam 230 as compared to cantilever beam 220, compression of connector assembly 35 between a component 30 and printed circuit board 45 results in beam 230 tending to push pin 200 vertically upward. This upward motion is limited by contact of projection 250 with surface 130. In contrast, contact of component 30 with the more easily deformable beam 220 tends to result in deformation of beam 220. As previously described, beam 220 is both tapered in width and also longer than beam 230, such that beam 220 is less resistant to bending than beam 230.

Referring to FIGS. 1 and 4, compression of a connector assembly 35 between a first object such as electrical component 30 and a second object such as printed circuit board 45 results in both vertical movement and deformation of pins 200. Owing to the greater stiffness of beam 230, contact of beam 230 with an object results in a first, lesser amount of upward bending and also vertical sliding movement of pin 200 within the guiding slots. This sliding movement is limited by contact of projection 250 with surface 130. Owing to the lesser stiffness of beam 220, contact of beam 220 with an object results in a second greater amount of downward bending. The downward bending movement of free end 225 of beam 220 is limited by contact of the inner surface of end 225 with top surface 111 of body 100. Further, beam 220 deflects to a recessed position between members 240 and 245 (which are slidingly received within the insulative body material of slots 120 and 125). This combination of contact of free end 225 with surface 111 of a first pin 220, the limited upward sliding movement of a second adjacent pin 200, and the deflection of the upper beam of the first pin to a recessed portion of the adjacent second pin prevents the shorting of adjacent pins 200 in apparatus 20. Thus, even though the beam 220 of a first pin overhangs the centerbody 205 of an adjacent second pin, each pin includes features that prevent inadvertent electrical contact.

The long length of upper beam 220 also improves the degree of contact between the pin and the electrical contacts of some objects by providing a wiping action. As an example, as beam 220 is elastically deformed downward by mating of assembly 35 and component 30, the free end 225 of beam 220 also moves laterally with respect to component 30. This lateral motion of free end 225 wipes against the corresponding contact of component 30, and in some cases mechanically removes any oxidation layer that has formed on the contact of the object. This oxidation layer is noted on board or IC contacts that have been tin plated. Removal of at least some of the oxidation layer reduces the contact resistance between the component contact and the free end of the pin.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. An apparatus for providing electrical continuity between two objects comprising:

a body with a top surface and a bottom surface and having a thickness extending between the top surface and the bottom surface, a first of said two objects being located at the top surface thereof and a second of said two objects being located at the bottom surface thereof, said body having a plurality of pin receptacles; and a plurality of pins, each one of said pins being located within a different one of said plurality of receptacles, each pin including a planar center body, a first cantilever beam extending from one portion of said center body at an acute angle relative to said center body, and a second cantilever beam extending from another portion of said center body at an acute angle relative to said center body;

wherein the first cantilever beam of each of said plurality of pins extends over the center body of an adjacent one of the plurality of pins.

2. The apparatus of claim 1, wherein the first cantilever beam is bent toward the center body of the adjacent one of the plurality of pins and contacts the top surface of the body when the first cantilever beam is depressed by contact with the first of said two objects being located at the upper surface of the body.

3. The apparatus of claim 1, wherein said first cantilever beam is longer than said second cantilever beam.

4. The apparatus of claim 1, wherein said plurality of receptacles are arranged in a matrix of rows and columns.

5. The apparatus of claim 1, wherein each said pin is freely slidable within the corresponding receptacle, and said center body includes a projection extending from a planar surface of the center body, said projection cooperating with a surface of the receptacle to limit sliding motion of said pin.

6. The apparatus of claim 1, wherein the first and second cantilever beams have different stiffnesses.

7. The apparatus of claim 1, wherein each of the plurality of pin receptacles includes a guiding slot arranged such that said pin is slidable within the guiding slot along the thickness of the body both in a direction toward the upper surface of the body and in a direction toward the bottom surface of the body.

8. The apparatus of claim 7, wherein each of said pins moves within the respective guiding slot along the thickness of the body toward the upper surface of the body in response to said second cantilever beam of said pin being deformed by contacting with the second of said two objects located at the bottom surface of the body.

9. The apparatus of claim 7, wherein each of said pins moves within the respective guiding slot along the thickness of the body toward the bottom surface of the body in response to said first cantilever beam of said pin being deformed by contacting with the first of said two objects located at the upper surface of the body.

10. The apparatus of claim 7, wherein the first member of each one of said plurality of pins cooperates with said guiding slot of the corresponding receptacle to guide said pin in only a vertical orientation within said receptacle in the thickness direction of the body.

11. The apparatus of claim 7, further comprising at least one stop member for stopping sliding movement of said pin in at least one of the direction toward the upper surface of the body and the direction toward the bottom surface of the body.

12. The apparatus of claim 7, wherein when the body is compressed by contact with each of the two objects, the first and second cantilever beams are deformed and the pin is moved within the guiding slot in the thickness direction of the body.

13. The apparatus of claim 1, wherein said center body includes a projection extending from a planar surface of the center body, each one of said pins is freely slidable in a respective one of said plurality of receptacles, and said projection cooperating with a surface of the receptacle to limit sliding motion of said pin.

14. The apparatus of claim 1, wherein each of said receptacles includes first and second guiding slots, each of said center bodies includes first and second members extending from said center body and coplanar with said center body, and a first member of each one of said plurality of pins is slidably received within said first guiding slot of the corresponding receptacle and a second member of said each one of said plurality of pins is slidably received within said second guiding slot of the corresponding receptacle to loosely guide said pin within said receptacle.

15. The apparatus of claim 1, wherein each receptacle includes an aperture extending from the top surface to the bottom surface of the body.

16. The apparatus of claim 1, wherein the first cantilever beam is located closer to the top surface of the body and the second cantilever beam is located closer to the bottom surface of the body.

17. The apparatus of claim 1, wherein the apparatus for providing electrical continuity between two objects is a land grid array connector.

18. The apparatus of claim 17, wherein the land grid array connector includes an integrated circuit packaged therein.

19. The apparatus of claim 17, wherein the land grid array connector is adapted to provide electrical connection between an electronic component and a printed circuit board.

20. An apparatus for providing electrical continuity between two objects comprising:

a body with a top surface and a bottom surface and having a thickness extending between the top surface and the bottom surface, a first of said two objects being located at the top surface thereof and a second of said two objects being located at the bottom surface thereof, said body having a plurality of pin receptacles, each of the plurality of pin receptacles including a guiding slot; and a plurality of pins, each one of said pins being located within a different one of said plurality of receptacles, each pin including a planar center body that is slidable within the guiding slot along the thickness of the body in a direction toward the upper surface of the body and in a direction toward the lower surface of the body, a first cantilever beam extending from one portion of said center body at a first acute angle relative to said center body, and a second cantilever beam extending from another portion of said center body at a second acute angle relative to said center body;

wherein the first and second acute angles are different from each other.

21. The apparatus of claim 20, wherein the first acute angle is about 45° to about 75°.

22. The apparatus of claim 20, wherein the first acute angle is about 52°.

23. The apparatus of claim 20, wherein the second acute angle is about 45° to about 80°.

24. The apparatus of claim 20, wherein the second acute angle is 64°.

25. The apparatus of claim 20, wherein the first cantilever beam of each of said plurality of pins extends over the center body of an adjacent one of the plurality of pins.

26. The apparatus of claim 25, wherein the first cantilever beam is bent toward the center body of the adjacent one of the plurality of pins and contacts the top surface of the body when the first cantilever beam is depressed by contact with the first of said two objects being located at the upper surface of the body.

27. The apparatus of claim 20, wherein said first cantilever beam is longer than said second cantilever beam.

28. The apparatus of claim 20, wherein said plurality of receptacles are arranged in a matrix of rows and columns.

29. The apparatus of claim 20, wherein each said pin is freely slidable within the corresponding receptacle, and said center body includes a projection extending from a planar surface of the center body, said projection cooperating with a surface of the receptacle to limit sliding motion of said pin.

30. The apparatus of claim 20, wherein the first and second cantilever beams have different stiffnesses.

31. The apparatus of claim 20, wherein each of said pins moves within the respective guiding slot along the thickness of the body toward the upper surface of the body in response to said second cantilever beam of said pin being deformed by contacting with the second of said two objects located at the bottom surface of the body.

32. The apparatus of claim 20, wherein each of said pins moves within the respective guiding slot along the thickness of the body toward the bottom surface of the body in response to said first cantilever beam of said pin being deformed by contacting with the first of said two objects located at the upper surface of the body.

33. The apparatus of claim 20, wherein the first member of each one of said plurality of pins cooperates with said guiding slot of the corresponding receptacle to guide said pin in only a vertical orientation within said receptacle in the thickness direction of the body.

34. The apparatus of claim 20, further comprising at least one stop member for stopping sliding movement of said pin in at least one of the direction toward the upper surface of the body and the direction toward the bottom surface of the body.

35. The apparatus of claim 20, wherein when the body is compressed by contact with each of the two objects, the first and second cantilever beams are deformed and the pin is moved within the guiding slot in the thickness direction of the body.

36. The apparatus of claim 20, wherein said center body includes a projection extending from a planar surface of the center body, each one of said pins is freely slidable in a respective one of said plurality of receptacles, and said projection cooperating with a surface of the receptacle to limit sliding motion of said pin.

37. The apparatus of claim 20, wherein each of said receptacles includes first and second guiding slots, each of said center bodies includes first and second members extending from said center body and coplanar with said center body, and a first member of each one of said plurality of pins is slidably received within said first guiding slot of the corresponding receptacle and a second member of said each one of said plurality of pins is slidably received within said second guiding slot of the corresponding receptacle to loosely guide said pin within said receptacle.

38. The apparatus of claim 20, wherein each receptacle includes an aperture extending from the top surface to the bottom surface of the body.

39. The apparatus of claim 20, wherein the first cantilever beam is located closer to the top surface of the body and the second cantilever beam is located closer to the bottom surface of the body.

40. The apparatus of claim 20, wherein the apparatus for providing electrical continuity between two objects is a land grid array connector.

41. The apparatus of claim 40, wherein the land grid array connector includes an integrated circuit packaged therein.

42. The apparatus of claim 40, wherein the land grid array connector is adapted to provide electrical connection between an electronic component and a printed circuit board.

43. An apparatus for providing electrical continuity between two objects comprising:

a body with a top surface and a bottom surface and having a thickness extending between the top surface and the bottom surface, a first of said two objects being located at the top surface thereof and a second of said two objects being located at the bottom surface thereof, said body having a plurality of pin receptacles; and a plurality of pins, each one of said pins being located within a different one of said plurality of receptacles, each pin including a planar center body, a first cantilever beam extending from one portion of said center body at an acute angle relative to said center body, and a second cantilever beam extending from another portion of said center body at an acute angle relative to said center body;

wherein the first cantilever beam is less resistant to bending than the second cantilever beam.

44. The apparatus of claim 43, wherein the acute angles of the first and second cantilever beam are different from each other.

45. The apparatus of claim 43, wherein the acute angle of the first cantilever beam is less than the acute angle of the second cantilever beam.

46. The apparatus of claim 43, wherein the first cantilever beam of each of said plurality of pins extends over the center body of an adjacent one of the plurality of pins.

47. The apparatus of claim 46, wherein the first cantilever beam is bent toward the center body of the adjacent one of the plurality of pins and contacts the top surface of the body when the first cantilever beam is depressed by contact with the first of said two objects being located at the upper surface of the body.

48. The apparatus of claim 43, wherein said first cantilever beam is longer than said second cantilever beam.

49. The apparatus of claim 43, wherein said plurality of receptacles are arranged in a matrix of rows and columns.

50. The apparatus of claim 43, wherein each said pin is freely slidable within the corresponding receptacle, and said center body includes a projection extending from a planar surface of the center body, said projection cooperating with a surface of the receptacle to limit sliding motion of said pin.

51. The apparatus of claim 43, wherein the first and second cantilever beams have different stiffnesses.

52. The apparatus of claim 43, wherein each of the plurality of pin receptacles includes a guiding slot arranged such that said pin is slidable within the guiding slot along the thickness of the body both in a direction toward the upper surface of the body and in a direction toward the bottom surface of the body.

53. The apparatus of claim 52, wherein each of said pins moves within the respective guiding slot along the thickness of the body toward the upper surface of the body in response to said second cantilever beam of said pin being deformed by contacting with the second of said two objects located at the bottom surface of the body.

54. The apparatus of claim 52, wherein each of said pins moves within the respective guiding slot along the thickness of the body toward the bottom surface of the body in response to said first cantilever beam of said pin being deformed by contacting with the first of said two objects located at the upper surface of the body.

55. The apparatus of claim 52, wherein the first member of each one of said plurality of pins cooperates with said guiding slot of the corresponding receptacle to guide said pin in only a vertical orientation within said receptacle in the thickness direction of the body.

56. The apparatus of claim 52, further comprising at least one stop member for stopping sliding movement of said pin in at least one of the direction toward the upper surface of the body and the direction toward the bottom surface of the body.

57. The apparatus of claim 52, wherein when the body is compressed by contact with each of the two objects, the first and second cantilever beams are deformed and the pin is moved within the guiding slot in the thickness direction of the body.

58. The apparatus of claim 43, wherein said center body includes a projection extending from a planar surface of the center body, each one of said pins is freely slidable in a respective one of said plurality of receptacles, and said projection cooperating with a surface of the receptacle to limit sliding motion of said pin.

59. The apparatus of claim 43, wherein each of said receptacles includes first and second guiding slots, each of said center bodies includes first and second members extending from said center body and coplanar with said center body, and a first member of each one of said plurality of pins is slidably received within said first guiding slot of the corresponding receptacle and a second member of said each one of said plurality of pins is slidably received within said second guiding slot of the corresponding receptacle to loosely guide said pin within said receptacle.

60. The apparatus of claim 43, wherein each receptacle includes an aperture extending from the top surface to the bottom surface of the body.

61. The apparatus of claim 43, wherein the first cantilever beam is located closer to the top surface of the body and the second cantilever beam is located closer to the bottom surface of the body.

62. The apparatus of claim 43, wherein the apparatus for providing electrical continuity between two objects is a land grid array connector.

63. The apparatus of claim 62, wherein the land grid array connector includes an integrated circuit packaged therein.

64. The apparatus of claim 62, wherein the land grid array connector is adapted to provide electrical connection between an electronic component and a printed circuit board.

65. An apparatus for providing electrical continuity between two objects comprising:

a body with a top surface and a bottom surface and having a thickness extending between the top surface and the bottom surface, a first of said two objects being located at the top surface thereof and a second of said two objects being located at the bottom surface thereof, said body having a plurality of pin receptacles each including a guiding slot; and a plurality of pins, each one of said pins being located within a different one of said plurality of receptacles, each pin including a planar center body, a first cantilever beam extending from one portion of said center body at an acute angle relative to said center body, and a second cantilever beam extending from another portion of said center body at an acute angle relative to said center body, wherein each of said pins is slidable within the guiding slot along the thickness of the body, and when the first and second cantilever beams are contacted by the first and second objects, respectively, the first cantilever beam is deflected by a first amount and the second beam is deflected by a second amount that is less than the first amount and causes the pin to slide within the guiding slot along the thickness of the body in a direction toward the top surface of the body.

66. The apparatus according to claim 65, wherein the acute angles of the first and second cantilever beam are different from each other.

67. The apparatus of claim 65, wherein the acute angle of the first cantilever beam is less than the acute angle of the second cantilever beam.

68. The apparatus of claim 65, wherein the first cantilever beam of each of said plurality of pins extends over the center body of an adjacent one of the plurality of pins.

69. The apparatus of claim 68, wherein the first cantilever beam is bent toward the center body of the adjacent one of the plurality of pins and contacts the top surface of the body when the first cantilever beam is depressed by contact with the first of said two objects being located at the upper surface of the body.

70. The apparatus of claim 65, wherein said first cantilever beam is longer than said second cantilever beam.

71. The apparatus of claim 65, wherein said plurality of receptacles are arranged in a matrix of rows and columns.

72. The apparatus of claim 65, wherein each said pin is freely slidable within the corresponding receptacle, and said center body includes a projection extending from a planar surface of the center body, said projection cooperating with a surface of the receptacle to limit sliding motion of said pin.

73. The apparatus of claim 65, wherein the first and second cantilever beams have different stiffnesses.

74. The apparatus of claim 65, wherein each of said pins moves within the respective guiding slot along the thickness of the body toward the upper surface of the body in response to said second cantilever beam of said pin being deformed by contacting with the second of said two objects located at the bottom surface of the body.

75. The apparatus of claim 65, wherein each of said pins moves within the respective guiding slot along the thickness of the body toward the bottom surface of the body in response to said first cantilever beam of said pin being deformed by contacting with the first of said two objects located at the upper surface of the body.

76. The apparatus of claim 65, wherein the first member of each one of said plurality of pins cooperates with said guiding slot of the corresponding receptacle to guide said pin in only a vertical orientation within said receptacle in the thickness direction of the body.

77. The apparatus of claim 65, further comprising at least one stop member for slopping sliding movement of said pin in at least one of the direction toward the upper surface of the body and the direction toward the bottom surface of the body.

78. The apparatus of claim 65, wherein said center body includes a projection extending from a planar surface of the center body, each one of said pins is freely slidable in a respective one of said plurality of receptacles, and said projection cooperating with a surface of the receptacle to limit sliding motion of said pin.

79. The apparatus of claim 65, wherein each of said receptacles includes first and second guiding slots, each of said center bodies includes first and second members extending from said center body and coplanar with said center body, and a first member of each one of said plurality of pins is slidably received within said first guiding slot of the corresponding receptacle and a second member of said each one of said plurality of pins is slidably received within said second guiding slot of the corresponding receptacle to loosely guide said pin within said receptacle.

80. The apparatus of claim 65, wherein each receptacle includes an aperture extending from the top surface to the bottom surface of the body.

81. The apparatus of claim 65, wherein the first cantilever beam is located closer to the top surface of the body and the second cantilever beam is located closer to the bottom surface of the body.

82. The apparatus of claim 65, wherein the apparatus for providing electrical continuity between two objects is a land grid array connector.

83. The apparatus of claim 82, wherein the land grid array connector includes an integrated circuit packaged therein.

84. The apparatus of claim 82, wherein the land grid array connector is adapted to provide electrical connection between an electronic component and a printed circuit board.

* * * * *